(12) United States Patent
Pan et al.

(10) Patent No.: US 7,224,007 B1
(45) Date of Patent: May 29, 2007

(54) MULTI-CHANNEL TRANSISTOR WITH TUNABLE HOT CARRIER EFFECT

(75) Inventors: James Pan, Fishkill, NY (US); Andrew M. Waite, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 171 days.

(21) Appl. No.: 10/873,240

(22) Filed: Jun. 23, 2004

Related U.S. Application Data

(63) Continuation of application No. 10/754,619, filed on Jan. 12, 2004, now abandoned.

(51) Int. Cl.
*H01L 29/768* (2006.01)
(52) U.S. Cl. .................. 257/241; 257/191; 257/406; 438/282; 438/288
(58) Field of Classification Search ............. 257/272, 257/406, 328, 191, 241; 438/282, 288
See application file for complete search history.

(56) References Cited

U.S. PATENT DOCUMENTS

| | | | | |
|---|---|---|---|---|
| 5,323,020 A | * | 6/1994 | Mohammad et al. | 257/19 |
| 5,461,250 A | * | 10/1995 | Burghartz et al. | 257/347 |
| 6,190,975 B1 | * | 2/2001 | Kubo et al. | 438/285 |
| 6,300,648 B1 | * | 10/2001 | Mei et al. | 257/59 |
| 6,492,216 B1 | * | 12/2002 | Yeo et al. | 438/197 |
| 6,583,015 B2 | * | 6/2003 | Fitzgerald et al. | 438/287 |
| 2004/0217430 A1 | * | 11/2004 | Chu | 257/410 |
| 2005/0045905 A1 | * | 3/2005 | Chu et al. | 257/103 |
| 2005/0104140 A1 | * | 5/2005 | Pan et al. | 257/411 |

* cited by examiner

*Primary Examiner*—Howard Weiss
*Assistant Examiner*—John Ingham
(74) *Attorney, Agent, or Firm*—McDermott Will & Emery

(57) ABSTRACT

A multiple channel transistor provides a transistor with an improved drive current and speed by using tunable hot carrier effects. A thin gate oxide has a carrier confinement layer formed on top thereof. Holes produced by hot carrier effects are retained by the carrier confinement layer directly above the gate oxide layer. The holes switch on the bottom transistor of the multi-channel transistor, thereby increasing the drive current.

10 Claims, 4 Drawing Sheets

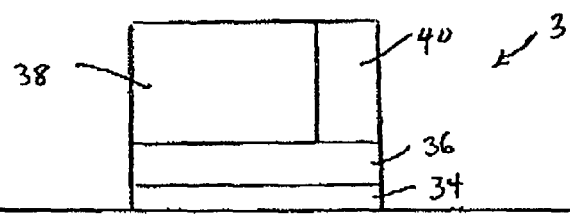
Fig. 4
Fig. 5
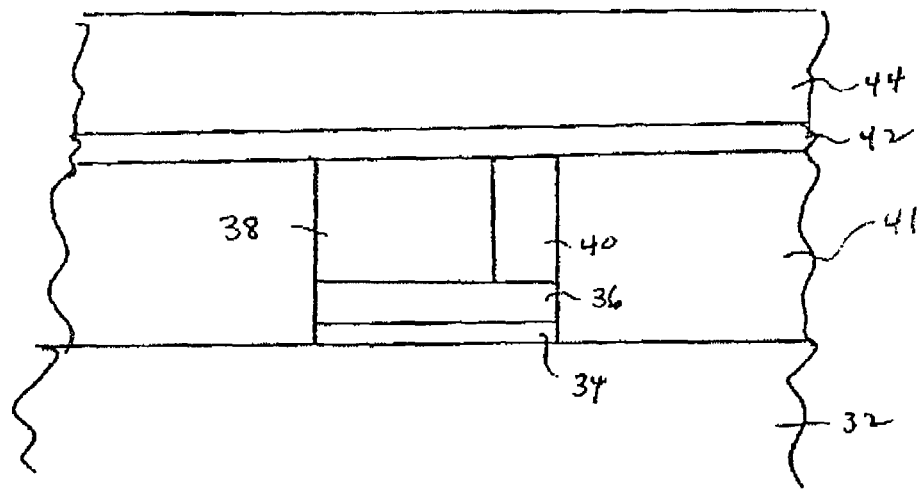
Fig 6
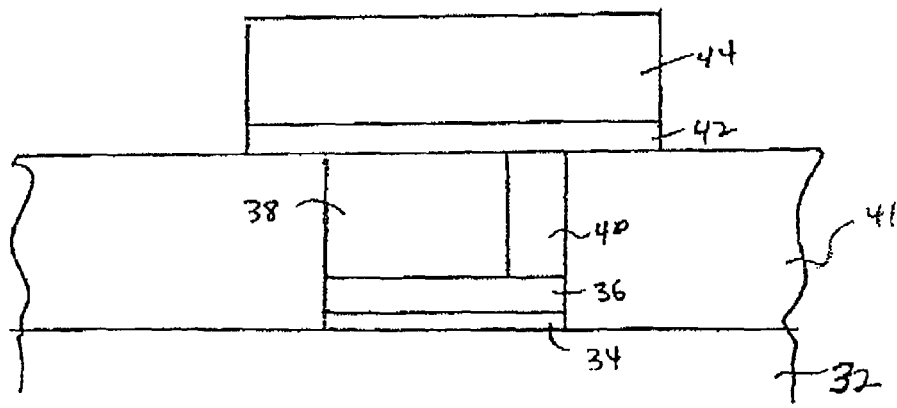

MULTI-CHANNEL TRANSISTOR WITH TUNABLE HOT CARRIER EFFECT

This application is a continuation of application Ser. No. 10/754,619, filed, Jan. 12, 2004 now abandoned.

FIELD OF THE INVENTION

The present invention relates to the field of semiconductor devices, and more particularly, to multi-channel devices.

BACKGROUND OF THE INVENTION

A conventional MOSFET operates by driving current through a channel region between the source and drain of a device. The conductivity of the channel region is modulated by the application of a voltage on the conducting gate above the channel surface and insulated from it. Efforts are ongoing within many MOS integrated circuit manufacturing companies as well as at many universities and government laboratories to improve the speed and available drive currents with MOSFETs to reduce their power consumption, and to improve their reliability and radiation hardness for applications in harsher remote environments, including space.

FIG. 1 shows a conventional partially depleted SOI (silicon-on-insulator) MOSFET that has been provided to achieve some of the improvements in speed and drive currents that have been needed. The OSI transistor 10 includes a silicon substrate 12 on which a buried oxide layer 14 is provided. A body layer 16, made of silicon, forms the area in which the semiconductor devices are located. The SOI transistor 10 includes a source region 18, a drain region 20 and a gate 26 that is provided on a gate oxide layer 22. Spacers 24 are formed on the sidewalls of the gate 26 and are employed as masks during the source/drain implantation process.

One of the concerns of a traditional partially depleted SOI MOSFET, such as the SOI transistor 10 of FIG. 1, is the decrease in the threshold voltage Vt of the transistor 10 due to hot carrier effects. As is well known, hot carrier effects in a transistor generate electron/hole pairs. Driven by electric fields, the electrons drift towards the gate 26, while the holes tend to drift toward the buried oxide layer 14. This movement of the holes toward the buried oxide layer undesirably decrease the threshold voltage Vt of the transistor 10.

A plot of Ids vs. Vds is shown in FIG. 2 for a conventional SOI MOSFET transistor 10, such as that depicted in FIG. 1. As can be readily appreciated, the well-known "kink effect" as depicted in FIG. 2, is due to the holes that have drifted near the buried oxide, the uncontrolled kinking increasing the substrate bias and thereby decreasing the threshold voltage Vt.

One of the goals in semiconductor processing is to maximize the use of the available silicon area. This allows increased miniaturization of the electronic circuitry. In particular, it is desirable to maximize the drive current for a given silicon area.

SUMMARY OF THE INVENTION

There is a need for providing a MOSFET in which the transistor drive current is increased, without increasing the gate voltage or increasing leakage current. The structure should be compatible with existing fabrication techniques and improve transistor operating speed without requiring more lithography levels or change in overall layout designs.

These and other needs are met by embodiments of the present invention that provide a multiple channel transistor comprising a silicon substrate, a first gate oxide layer on a substrate, and a carrier confinement layer on the first gate oxide layer. A silicon layer is provided on the carrier confinement layer, the silicon layer and the carrier confinement layer having sidewalls. A second gate oxide layer is provided on the silicon layer, and a gate is formed on the second gate oxide layer. Source and drain regions are provided in the substrate and on the silicon layer sidewalls and the carrier confinement layer sidewalls.

The use of a carrier confinement layer formed on a first gate oxide layer provides a multiple channel transistor in which charge carriers are confined to the region above the gate oxide layer, which is much thinner than the buried oxide layer of SOI MOSFETs. Hence, the hot carrier effects produces holes, for example, that are confined by the carrier confinement layer above the gate oxide layer. These holes near the bottom gate oxide layer switch on the bottom channel formed in the substrate. The hot carrier effect is thereby tunable to produce a controlled kinking in the Ids vs. Vds plot. This improves the drive current in comparison to conventional devices.

The earlier stated needs are also met by other embodiments of the present invention which provide a multi-channel transistor comprising a first channel and a second channel, and a carrier confinement layer between the first and second channels. The carrier confinement layer operates to confine carriers produced by hot carrier effects in the first channel these carriers switching on the second channel.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 4 is a schematic, cross-sectional view of a multi-channel transistor during one phase of manufacture in accordance with embodiments of the present invention.

FIG. 5 shows the structure of FIG. 4 following the deposition of a sacrificial layer, a gate oxide layer and a polysilicon gate layer in accordance with embodiments of the present invention.

FIG. 6 shows the structure of FIG. 5 after etching to form the gate in accordance with embodiments of the present invention.

DETAILED DESCRIPTION

Figure 1:
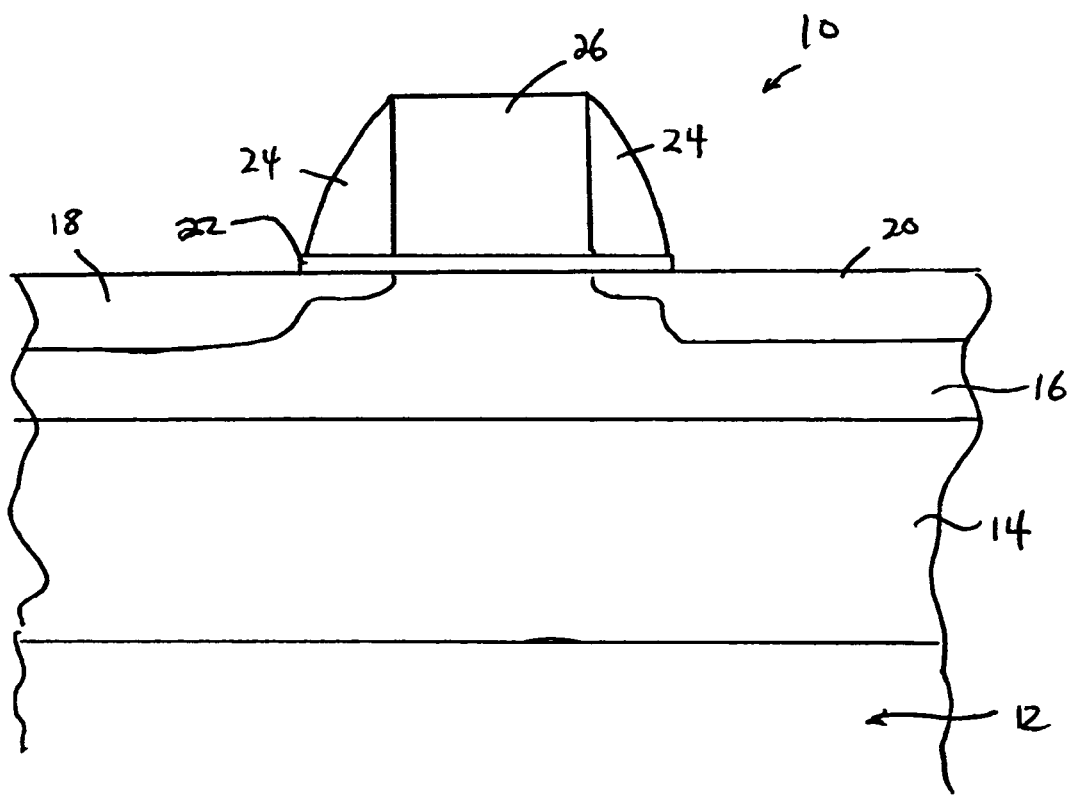
FIG. 1 is a schematic, cross-sectional view of an SOI MOSFET constructed in accordance with prior art methodologies.
Figure 2:
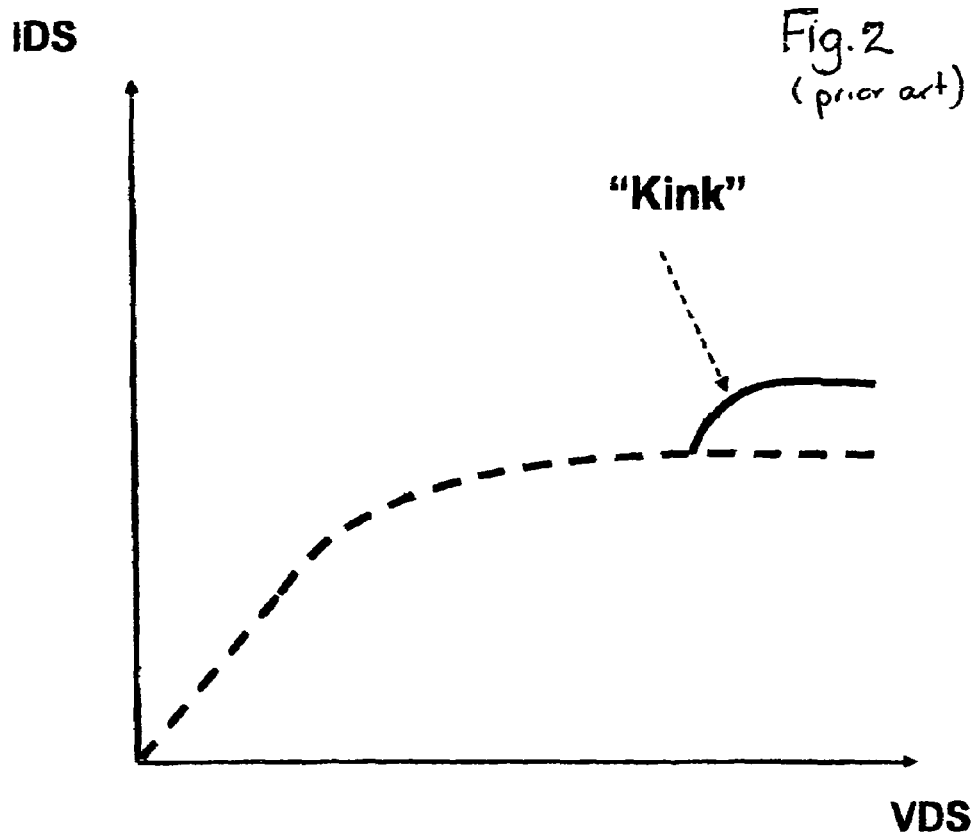
FIG. 2 is a plot of Ids vs. Vds for the SOI MOSFET of FIG. 1.

The present invention addresses and solves problems related to increasing the drive current of transistors and achieves this, in part, by the proper adjustment and tuning of hot carrier effects in a multi-channel transistor. The invention provides for a multi-channel transistor having a relatively thin gate oxide layer provided on a silicon substrate and a charge confinement layer on the gate oxide layer. The charge confinement layer, which may be silicon germanium or other high dielectric constant semiconductor material, operates to confine charge carriers produced by the hot carrier effects. Rather than allowing the holes created by hot carrier effects to drift towards a buried oxide layer and decrease the threshold voltage of a transistor, the holes created by the hot carrier effects in the present invention are confined by the charge confinement layer directly above a gate oxide layer to switch on the channel formed in the substrate underneath the gate oxide layer. This produces an increased drive current for a given silicon area. The multiple-channel approach of the present invention achieves an improved MOSFET drive current with no increase in the gate voltage or leakage current, and improves transistor operating speed without increasing the number of lithography levels or requiring a change in layout designs.

FIGS. 4–9 describe the method of making a multiple-channel device in accordance with embodiments of the present invention. The description will discuss certain materials and process steps in an exemplary manner, but it should be recognized that these materials and process steps are exemplary only as other materials and process steps may be employed without departing from the scope of the present invention.

FIG. 4 is a schematic, cross-sectional view of a portion of a semiconductor device during one phase of manufacture in accordance with embodiments of the present invention. A stack 30 has been created on a substrate 32 by a dry etching of layers that have been previously formed. The stack 30 of FIG. 4 includes a first gate oxide layer 34 that has been formed to a thickness of between about 10 to about 20 Å in exemplary embodiments. Conventional techniques for forming a gate oxide layer may be employed.

A charge confinement layer 36 is formed on the first gate oxide layer 34. The charge confinement layer 36, in preferred embodiments, is a high dielectric constant semiconductor material. Candidate materials include silicon germanium and p-Ge material. These materials are particularly well suited for use as a charge confinement layer for confining holes for n-channel devices. For p-channel devices, a material should be selected that will confine electrons suitably. Candidate materials include SiGeC. These materials are exemplary only, as other charge confinement materials may be employed without departing from the scope of the present invention. An exemplary thickness range for the charge confinement layer is between about 50 Å to about 200 Å.

A silicon layer 38 is formed on the carrier confinement layer 36. In certain embodiments of the invention, the silicon layer 38 is a strained silicon layer as there is a mismatch between the silicon in layer 38 and the silicon germanium (or p-Ge) in layer 36. This serves to improve carrier mobility in the silicon layer 38.

A specially doped region 40 is provided that has been doped by an angled, or tilted, doping to create a more heavily doped region. For example, the doping may be between $1 \times 10^{17}$ to $1 \times 10^{20}$. The specially doped region will provide the desired hot carrier effects in the present invention. Suitable techniques for creating a specially doped region, such as by tilted doping or angled doping, are well-known to those of skill in the art.

Once the layers are formed, the stack 30 is created by a dry etch technique, such as by reactive ion etching. The doping of region 40 is performed after the dry etching has been performed. Conventional spacer formation, extension implants and source/drain implants are then performed at this stage of the process.

FIG. 5 shows the structure of FIG. 4 following the further processing of layers on the substrate 32 and the stack 30. These layers includes a sacrificial layer 41 that is deposited and then planarized. An exemplary material for the sacrificial layer 41 is a nitride, such as silicon nitride. The planarization may be accomplished by chemical-mechanical planarization, for example.

Following the formation of the sacrificial layer 41, a second gate oxide layer 42 is formed by conventional methodologies. An exemplary thickness for the second gate oxide layer 42 is between about 10 to about 30 Å, for example. This range of thicknesses is exemplary only, however. A polysilicon gate layer 44 is deposited over the gate oxide layer 42 in a conventional manner.

FIG. 6 shows the structure of FIG. 5 following the dry etching of the polysilicon gate layer 44 and the second gate oxide layer 42. The etching is selective so that the etch steps upon the sacrificial layer 41.

The sides of the gate 44 must be protected from contact with the source and drain regions that will be formed on the sides thereof. Accordingly, in FIG. 7, a protective layer 46 is deposited over the gate 44, as well as being formed on the sacrificial layer 41. In certain embodiments of the invention, the protective layer 46 is an oxide, for example. A relatively thin layer 46 may be employed, and is advantageous in that etching may be performed more rapidly with a thinner layer, while still providing a sufficiently thick protective spacer on the sidewalls of the gate 44. Conventional deposition and etching techniques may be employed to form the protective layer 46.

Figure 7:
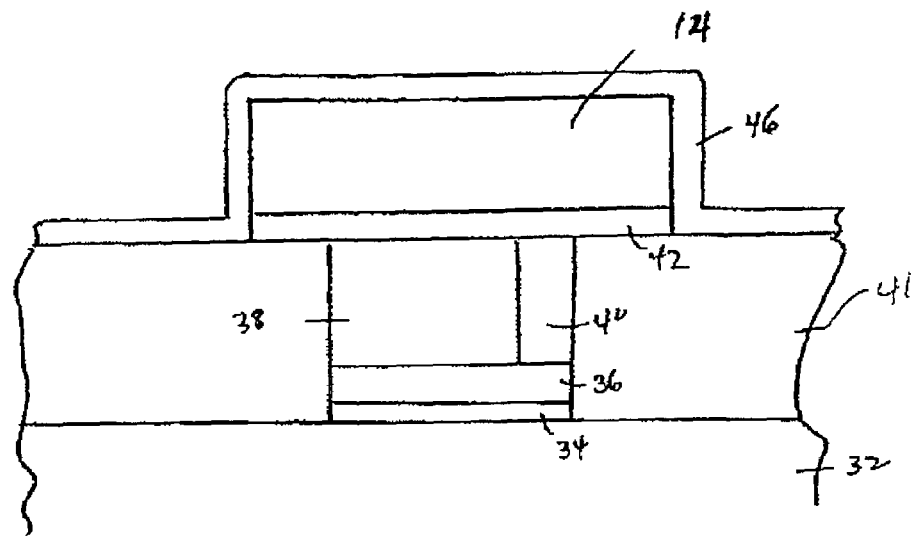
FIG. 7 depicts the structure of FIG. 6 following the formation of a protective layer over the gate in accordance with embodiments of the present invention.
Figure 8:
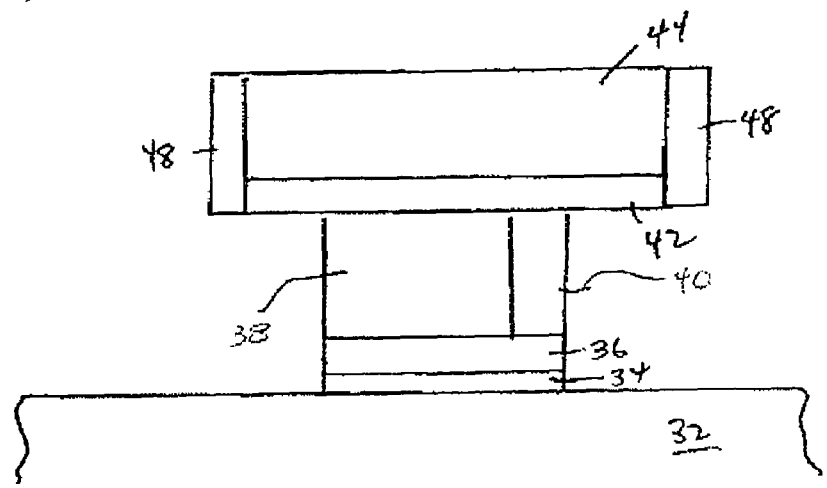
FIG. 8 shows the structure of FIG. 7 after etching of the protective layer to form protective sidewall spacers on the gate and a removal of the sacrificial layer in accordance with embodiments of the present invention.

FIG. 8 depicts the structure of FIG. 7 following the dry, anisotropic etching of the protective layer 46, leaving the protective spacers 48 on the sidewalls of the gate 44. Following this first, dry etching of the protective layer 46, a wet etching is then performed to remove the sacrificial layer 41. A selective wet etch is used to remove the nitride, for example, of the sacrificial layer 41 without etching the protective spacers 48 or the gate oxides 42, 34.

Figure 9:
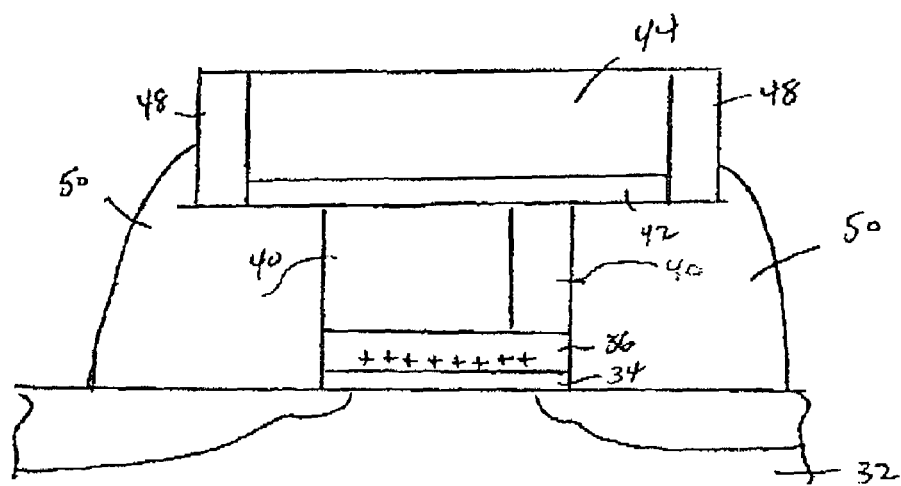
FIG. 9 depicts the structure of FIG. 8 following the conformal deposition of a silicon layer and etching of the silicon layer to form source and drain regions in accordance with embodiments of the present invention.

FIG. 9 shows the structure of FIG. 8 after a silicon layer has been deposited, by chemical vapor deposition (CVD), for example. Deposition of a doped silicon layer is performed, or a post-deposition implantation is used to dope deposited silicon. Dopant concentration in these regions 50 is between about $5 \times 10^{17}$ to about $1 \times 10^{20}$, for example. A silicon etch is employed to form the silicon regions 50 that contact the stack 30. These silicon regions 50 are electrically isolated from the gate electrode 44 by the second gate oxide 42 and the protective spacers 48. Hence, source and drain regions 50 are created by the silicon regions.

Figure 3:
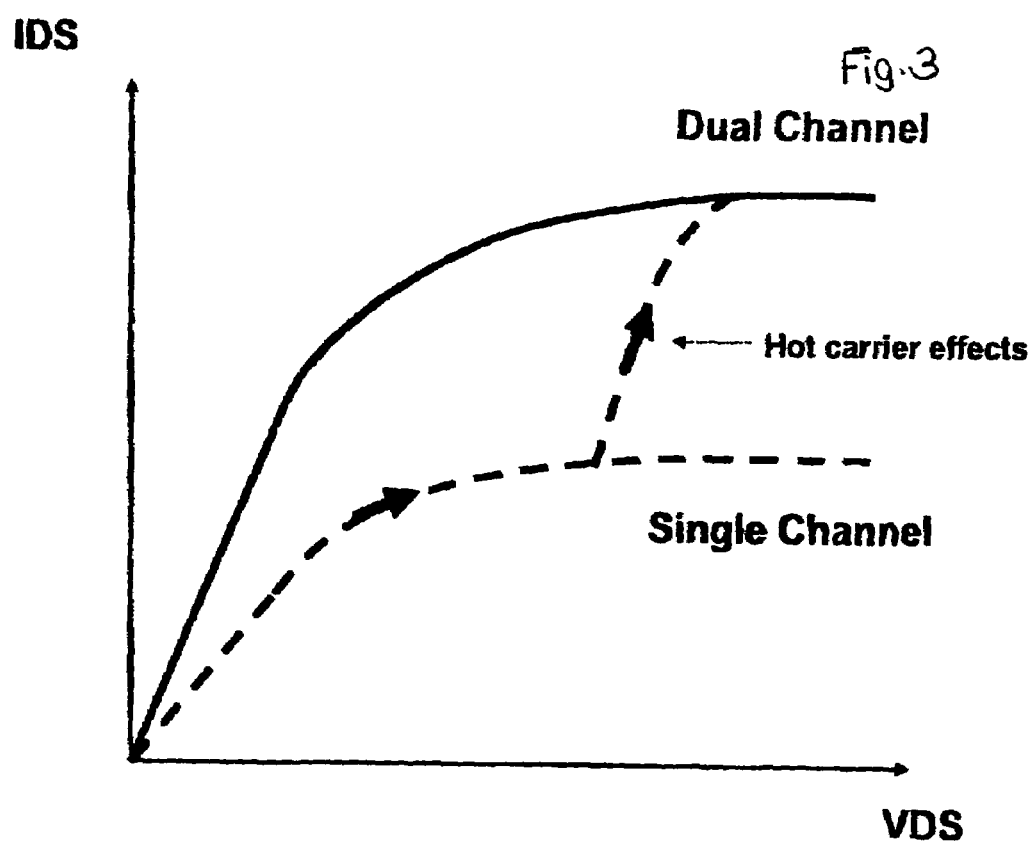
FIG. 3 is a plot of Ids vs. Vds for the multi-channel transistor of FIG. 9 of the present invention.

In operation, the specially doped region 40 serves to create hot carrier effects that produce holes (in an n-channel transistor) that drift towards first gate oxide layer 34. These charge carriers are retained by the carrier confinement layer 36. Without such a layer, the carriers would tend to drift throughout the silicon region 38 and not provide the desired effect. Thus, with the holes retained by the carrier confinement layer 36 directly above the first gate oxide layer 34, a channel is formed in the substrate 32, switching the transistor on. Also, in the silicon region 38, another channel is formed underneath the second gate oxide layer 42. There are therefore two channels formed in this multi-channel transistor. The hot carrier effects are controlled by the present invention to produce increased drive current, as shown in FIG. 3, that depicts an exemplary plot of Ids vs. Vds. The kink is a controlled kink, leading to the increased drive current provided by the multi-channel transistor of the present invention, including the carrier confinement layer 36.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A multiple channel transistor comprising:
   a silicon substrate;
   a first gate oxide layer on the substrate;
   a carrier confinement layer directly on the first gate oxide layer;
   a silicon layer with a heavily doped region at one end on the carrier confinement layer, the silicon layer and the carrier confinement layer having sidewalls;
   a second gate oxide layer on the silicon layer;
   a gate on the second gate oxide layer; and
   source and drain regions in the substrate and on the silicon layer sidewalls and the carrier confinement layer sidewalls.

2. The transistor of claim 1, wherein the carrier confinement layer is between about 50 Å to about 200 Å thick.

3. The transistor of claim 2, wherein the carrier confinement layer consists of SiGe.

4. The transistor of claim 2, wherein the carrier confinement layer consists of doped Ge.

5. The transistor of claim 2, wherein the carrier confinement layer consists of a high dielectric constant semiconductor.

6. The transistor of claim 1, wherein the silicon layer is a strained silicon layer.

7. The transistor of claim 1, wherein the substrate includes a strained silicon layer.

8. The transistor of claim 1, wherein the carrier confinement layer is a hole confinement layer.

9. The transistor of claim 1, wherein the carrier confinement layer is an electron confinement layer.

10. The transistor of claim 1, wherein the heavily doped region is doped to a concentration between $1\times10^{17}$ to $1\times10^{20}$.

* * * * *